(12) United States Patent
Dabral et al.

(10) Patent No.: US 10,985,107 B2
(45) Date of Patent: Apr. 20, 2021

(54) SYSTEMS AND METHODS FOR FORMING DIE SETS WITH DIE-TO-DIE ROUTING AND METALLIC SEALS

(71) Applicant: Apple Inc., Cupertino, CA (US)

(72) Inventors: Sanjay Dabral, Cupertino, CA (US); Jun Zhai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/583,082

(22) Filed: Sep. 25, 2019

(65) Prior Publication Data

US 2020/0075497 A1    Mar. 5, 2020

Related U.S. Application Data

(63) Continuation of application No. 15/801,163, filed on Nov. 1, 2017, now Pat. No. 10,438,896.

(Continued)

(51) Int. Cl.
*H01L 23/48*    (2006.01)
*H01L 21/44*    (2006.01)
(Continued)

(52) U.S. Cl.
CPC .......... *H01L 23/5389* (2013.01); *H01L 22/32* (2013.01); *H01L 23/488* (2013.01); *H01L 23/49838* (2013.01); *H01L 23/522* (2013.01); *H01L 23/5283* (2013.01); *H01L 23/58* (2013.01); *H01L 24/19* (2013.01); *H01L 24/20* (2013.01); *H01L 24/24* (2013.01);
(Continued)

(58) Field of Classification Search
CPC ... H01L 24/19; H01L 23/5389; H01L 23/488; H01L 24/20; H01L 24/24; H01L 24/73; H01L 24/92; H01L 25/18; H01L 22/32; H01L 23/522; H01L 23/5283; H01L 23/58; H01L 23/49838
See application file for complete search history.

(56) References Cited

U.S. PATENT DOCUMENTS 7,482,675 B2    1/2009   Adkisson et al.
7,518,229 B2    4/2009   Cotte et al.
(Continued)

OTHER PUBLICATIONS

Wafer-Scale Integration of Systolic Arrays, Tom Leighton, Charles E. Leiserson, IEEE Transactions on Computers, vol. c-34, No. 5, May 1985.
(Continued)

*Primary Examiner* — Alonzo Chambliss
(74) *Attorney, Agent, or Firm* — Jaffery Watson Mendonsa & Hamilton LLP

(57) ABSTRACT

Stitched die structures, and methods for interconnecting die are described. In an embodiment, a stitched die structure includes a semiconductor substrate that includes a first die area of a first die and a second die area of a second die separate from the first die area. A back-end-of-the-line (BEOL) build-up structure spans over the first die area and the second die area, and includes a first metallic seal directly over a first peripheral area of the first die area, a second metallic seal directly over a second peripheral area of the second die area, and a die-to-die routing extending through the first metallic seal and the second metallic seal to electrically connect the first die to the second die.

20 Claims, 15 Drawing Sheets

Related U.S. Application Data

(60) Provisional application No. 62/484,330, filed on Apr. 11, 2017.

(51) Int. Cl.

| | | |
|---|---|---|
| *H01L 23/538* | (2006.01) | |
| *H01L 23/488* | (2006.01) | |
| *H01L 23/00* | (2006.01) | |
| *H01L 25/18* | (2006.01) | |
| *H01L 21/66* | (2006.01) | |
| *H01L 23/522* | (2006.01) | |
| *H01L 23/528* | (2006.01) | |
| *H01L 23/58* | (2006.01) | |
| *H01L 23/498* | (2006.01) | |

(52) U.S. Cl.
CPC .............. *H01L 24/73* (2013.01); *H01L 24/92* (2013.01); *H01L 25/18* (2013.01); *H01L 22/34* (2013.01)

(56) References Cited

U.S. PATENT DOCUMENTS

| | | | | |
|---|---|---|---|---|
| 8,164,171 | B2* | 4/2012 | Lin | ..................... H01L 23/5385 257/686 |
| 10,438,896 | B2* | 10/2019 | Dabral | .................. H01L 23/522 |
| 2009/0160029 | A1 | 6/2009 | Pitts et al. | |
| 2010/0193931 | A1 | 8/2010 | Do et al. | |
| 2013/0256659 | A1* | 10/2013 | Tsai | ........................ H01L 22/12 257/48 |
| 2014/0120696 | A1 | 5/2014 | Aleksov et al. | |
| 2014/0319522 | A1* | 10/2014 | Daubenspeck | ......... H01L 24/13 257/48 |
| 2015/0262844 | A1 | 9/2015 | Meyer et al. | |
| 2015/0294954 | A1 | 10/2015 | Leung et al. | |
| 2018/0294230 | A1 | 10/2018 | Dabral et al. | |
| 2019/0181170 | A1 | 6/2019 | Oishi et al. | |
| 2020/0105682 | A1 | 4/2020 | Liu et al. | |

OTHER PUBLICATIONS

Wafer scale Integration (WSI) of Programmable Gate Arrays (PGA's), J.F. McDonald, S. Dabral, R. Philhower, M.E. Russinovich, Wafer Scale Integration, 1990. Proceedings., [2nd] International Conference on Wafer Scale Integration.

3D Technology Trends & Key Manufacturing Challenges, Focus on Lithography. From Technologies to Market. IMAPS—Lunch Keynote. YOLE Development. May 2015. Retrieved on Oct. 8, 2017 from: http://www.imapsne.net/2015%20Presentations/Keynote_2015_YOLE.pdf.

VPG series, High Speed Pattern Generator. Heidelberg Instruments, (n.d.). Retrieved on Oct. 8, 2017 from: http://www.himt.de/files/Factshele1e8t%20Download/HIMT%20Fact%20Sheet%20VPG%20Series%20200-400.pdf.

* cited by examiner

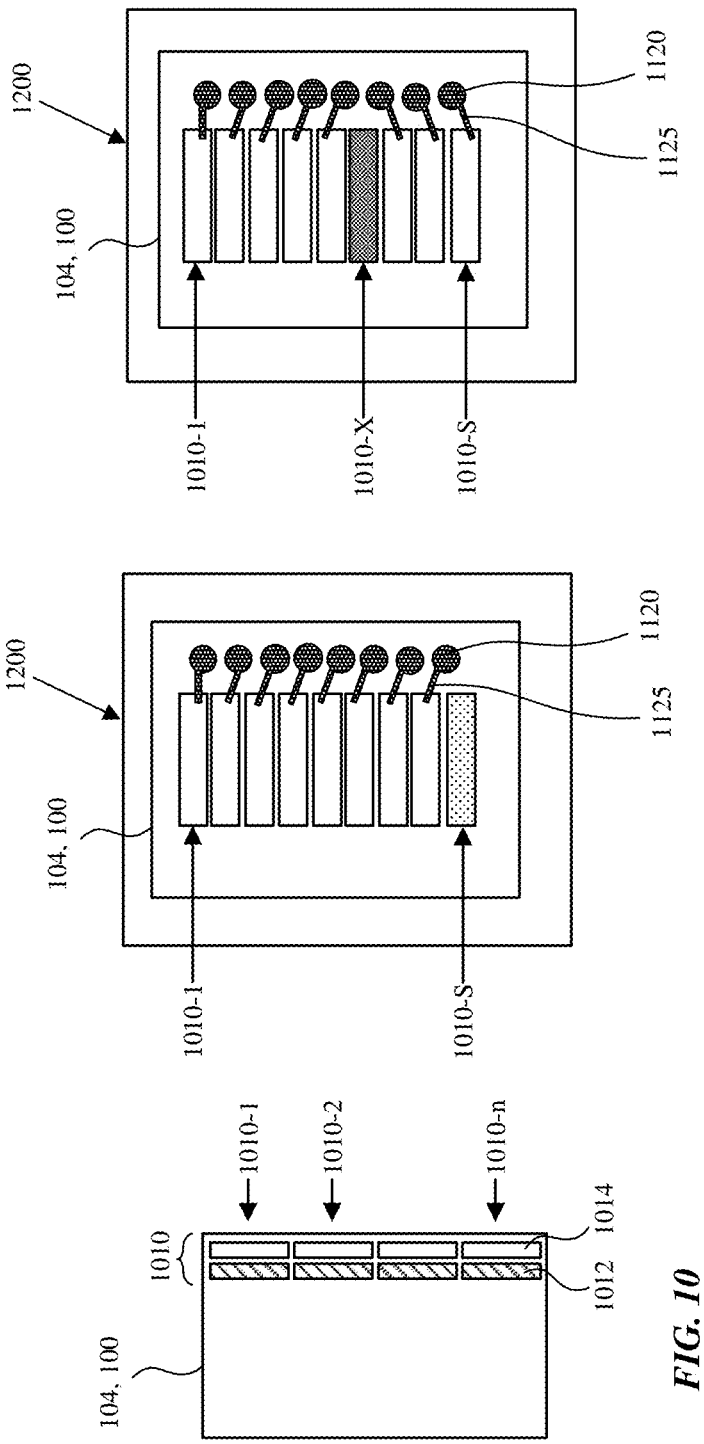

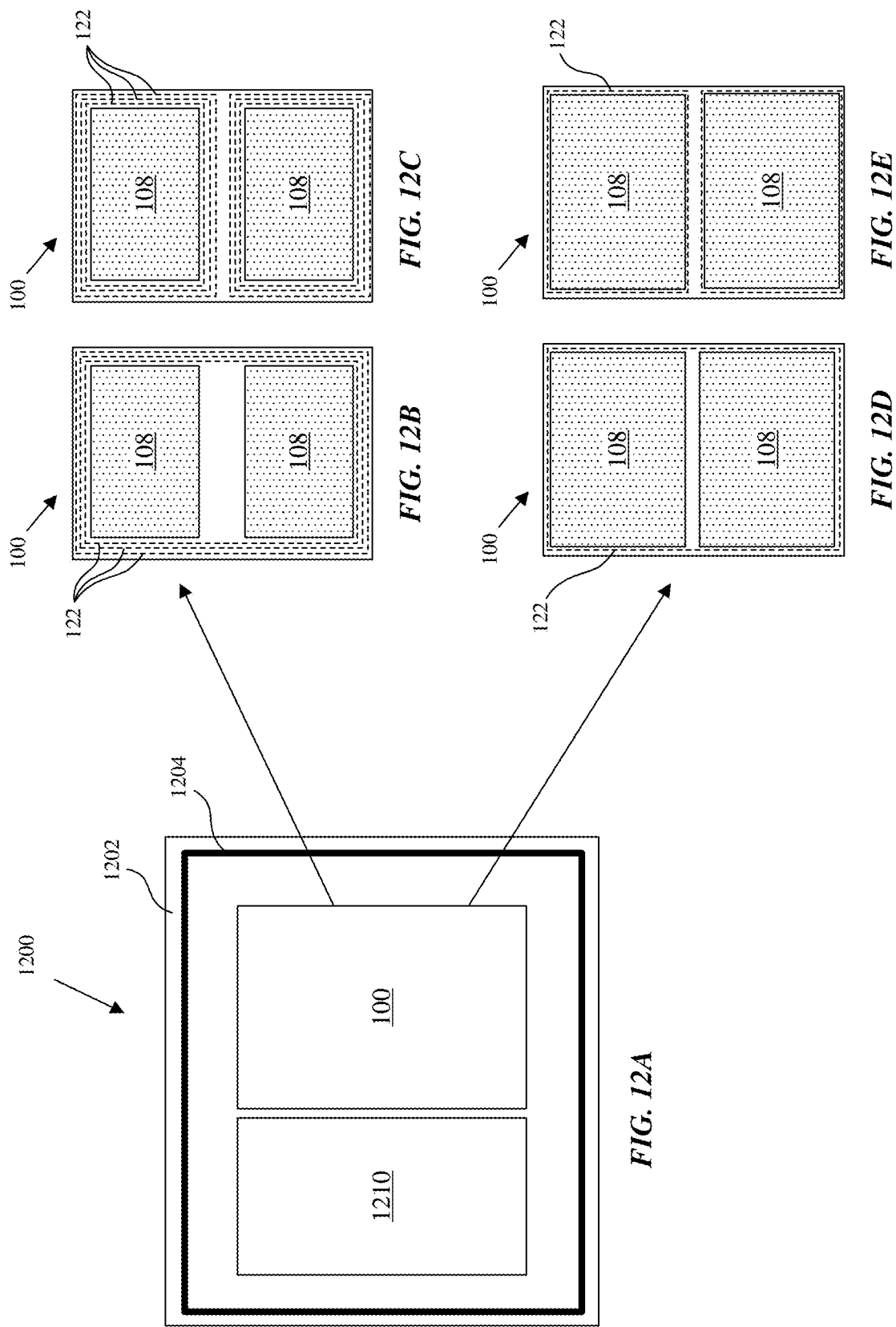

SYSTEMS AND METHODS FOR FORMING DIE SETS WITH DIE-TO-DIE ROUTING AND METALLIC SEALS

RELATED APPLICATIONS

This application is a continuation of U.S. patent application Ser. No. 15/801,163 filed on Nov. 1, 2017, which claims the benefit of priority from U.S. Provisional Patent Application Ser. No. 62/484,330 filed on Apr. 11, 2017, both of which are incorporated herein by reference.

BACKGROUND

Field

Embodiments described herein relate to integrated circuit (IC) manufacture, and the interconnection of multiple die.

Background Information

Microelectronic fabrication of ICs is typically performed using a sequence of deposition and patterning of circuit elements in a layer-by-layer sequence in which a stepper (or scanner) is used to pass light through a reticle, forming an image of the reticle pattern on an underlying layer. Rather than expose an entire wafer, the stepper moves in steps across the wafer from one die area location to another. In this manner, working on a limited area enables higher resolution and critical dimensions.

Current high end steppers or scanner systems are 4× or 5× reduction systems. Thus, the reticle features are 4 or 5 times the size of the feature to be formed on the wafer. Furthermore, one known standard size of reticles is approximately a 5 inch (127 mm) plate. At 4×, this corresponds to an approximately 32 mm field size at the wafer level. Thus, depending upon the manufacturer and equipment, 32 mm may be considered an exemplary upper limit on die size lateral dimension.

A multi-chip module (MCM) is generally an electronic assembly in which multiple die are integrated on a substrate. Various implementations of MCMs include 2D, 2.5D and 3D packaging. Generally, 2D packaging modules include multiple die arranged side-by-side on a package substrate. In 2.5D packaging technologies multiple die and bonded to an interposer with microbumps. The interposer in turn is then bonded to a package substrate. The interposer may include routing to interconnect the adjacent die. Thus, the die in 2.5D packaging can be directly connected to the interposer, and are connected with each other through routing within the interposer. Generally, 3D packaging modules include multiple die stacked vertically on top of each other. Thus, the die in 3D packaging can be directly connected to each other, with the bottom die directly connected to a package substrate. The top die in a 3D package can be connected to the package substrate using a variety of configurations, including wire bonds, and through-silicon vias (TSVs) though the bottom die.

SUMMARY

Stitched die structures and methods of interconnecting die are described in which adjacent die are interconnected with a die-to-die routing formed within a back-end-of-the line (BEOL) build-up structure that spans over adjacent die areas on a semiconductor substrate. The die-to-die routing in accordance with embodiments may be formed of a variety of layers, including pre-formed die routing within the die areas (e.g. formed using the die area reticles), stitch routing (e.g. formed with stitching tools), and layers within multiple levels of the BEOL build-up structure. Furthermore, the die-to-die routing may be formed using multiple layers with different design rules (e.g. line width, line thickness, line spacing, line pitch, etc.). Embodiments may be used to interconnect a variety of die together such as, but not limited to, die including functionality such as graphics processing units (GPUs) and a central processing units (CPUs). Additionally, high density interconnects can be formed at chip-like density and cost, with flexibility to scribe out good clusters, which can vary from single die to a large number of die on a wafer.

In one implementation, the metallic seals and die-to-die routing are pre-formed during formation of the BEOL build-up structure. The die may then be tested to bin the die into clusters, followed by dicing of die sets within stitched die structures. In another implementation, the metallic seals are not pre-formed. In such an embodiment, the formation of die-to-die routing and selection of scribe/dicing areas is customized around each die. In accordance with embodiments, the stitched die structures described may be mounted on a module substrate along with any other module chips and surrounded by a hermetic seal, which can provide an additional layer of protection to the metallic seal(s), or facilitate relaxing some of the on-chip seal and/or keep out zone requirements of the stitched die structures.

BRIEF DESCRIPTION OF THE DRAWINGS

FIG. 10 is a schematic illustration of a die-to-die input/output circuit including digital and analog components in accordance with an embodiment.

FIG. 11A is a schematic illustration of a die I/O connection configuration with an unused spare I/O circuit in accordance with an embodiment.

FIG. 11B is a schematic illustration of a die I/O connection configuration with a connected spare I/O circuit in accordance with an embodiment.

FIG. 12A is a schematic top view illustration of a module including a stitched die structure in accordance with an embodiment.

FIGS. 12B-12E are schematic top view illustrations stitched die structures including metallic seals around active areas in accordance with embodiments.

DETAILED DESCRIPTION

Figure 1:
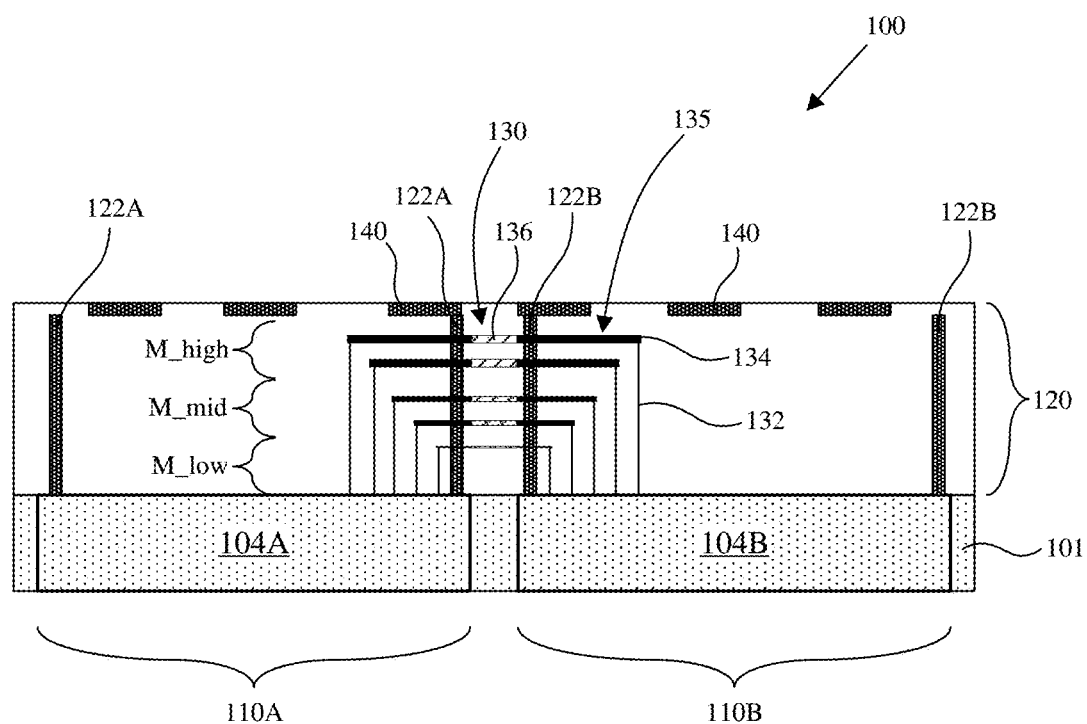
FIG. 1 is a schematic cross-sectional side view illustration of a stitched die structure in accordance with an embodiment.

Embodiments describe stitched die structures, and methods for interconnecting die. Specifically, embodiments utilize die stitching tools to interconnect die while at the wafer level, followed by carving out multiple die sets during dicing. In one aspect, die stitching may facilitate the use of smaller tiles, or die areas, which can lead to better yielding. For example, smaller die areas may result in less defects per die, higher wafer utilization (die per wafer), and allowing chip scaling (e.g. 1 core . . . n core). In another aspect, die stitching in accordance with embodiments can be utilized to fabricate die sets that are larger than a single reticle size.

In another aspect, the stitched die structures may facilitate the formation of high density die-to-die interconnects at a chip like density, using line and spacing dimensions utilized in BEOL processing. Additionally, the stitched die structures preserve the ability to be directly connected to a packaging substrate or circuit board. The stitched die structures in accordance with embodiments, may allow for reduced input/output (I/O) area (e.g. including bond pads), and improved electrical characteristics (e.g. power requirements, capacitance), and reduced latency commonly associated with existing packaging solutions. For example, microbumping pitch (e.g. die to interposer) commonly found in 2.5D packaging solutions is commonly in the tens of microns. In accordance with embodiments, on-chip metal/via pitch can be submicron. In accordance with embodiments, the I/O area and beachfront may be on the order of a magnitude less than traditional solutions.

In accordance with embodiments, multiple die are stitched together when forming the back-end-of-the-line (BEOL) build-up structure over multiple die at the wafer scale. In an embodiment, a stitched die structure includes multiple die with the same functionality, such as a graphics processing unit (GPU) or central processing unit (CPU). Thus, an exemplary stitched die structure may include a multiple GPU die stitched together, or multiple CPU die stitched together, though embodiments are not limited to these specific ICs.

In accordance with embodiments, the stitched die structures include one or more metallic seals around a peripheral area of the die. For example, the metallic seals may provide physical protection (e.g. from environment (e.g. moisture), stress, micro-cracks) and/or electrical protection (e.g. electromagnetic interference, electrostatic discharge). In some embodiments, the die-to-die routing is formed through the metallic seals of each die in the stitched die structure. In other embodiments, the metallic seals are selectively formed around groups of die in the stitched die structures, where die-to-die routing is formed inside the metallic seal perimeter. In application, modules including the stitched die structure and any other chips can be hermetically sealed. This adds additional protection to the seal rings. For example, moisture (or other environmental factor) has to navigate through the hermetic barrier first, and the metallic seal is an added layer of protection. This may be particularly applicable for high reliability systems. Alternatively, the metallic seals may facilitate relaxing some of the on-chip seal and/or keep out zone requirements for cost-sensitive systems.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or connected "to" or in "contact" with another layer may be directly in contact with the other layer or may have one or more intervening layers. One layer "between" layers may be directly in contact with the layers or may have one or more intervening layers.

Referring now to FIG. 1 a schematic cross-sectional side view illustration is provided of a stitched die structure 100 in accordance with an embodiment. As shown, a stitched die structure 100 may include a semiconductor substrate 101 including a first die area 110A of a first die 104A and a second die area 110B of a second die 104B separate from the first die area 110A. A back-end-of-the-line (BEOL) build-up structure 120 spans over the first die area 110A and the second die area 110B. In an embodiment, the BEOL build-up structure 120 includes a first metallic seal 122A directly over a first peripheral area of the first die area 110A, a second metallic seal 122B directly over a second peripheral area of the second die area 110B. For example, the first and second metallic seals 122A, 122B may be seal rings. The BEOL build-up structure 120 additionally includes die-to-die routing 130 that extends through the first metallic seal 122A and second metallic seal 122B to electrically connect the first die 104A to the second die 104B. The BEOL build-up structure 120 may additionally include a plurality of contact pads 140 such as, but not limited to, under bump metallurgy pads, which may be electrically connected to the first and second die 104A, 104B, and optionally the metallic seals 122A, 122B.

Still referring to FIG. 1, the die-to-die routing 130 may include die routing 135 from each die connected with stitch routing 136. In accordance with embodiments, the die routing 135 may be formed from one or more vias 132 and metal layers 134 within the BEOL build-up structure 120. In the particular embodiment illustrated, the die-to-die routing 130 includes multiple routings, formed within multiple metal layers. In accordance with embodiments, the die-to-die routing 130 can be formed within the lower metal layers M_low, upper metal layers M_high, midlevel metal layers M_mid, and combinations thereof. Generally, the lower metal layers M_low have finer line widths and spacing. This may be attributed to making connections between devices. The upper metal layers M_high may have coarser line widths and line spacing, with the midlevel metal layers M_mid having intermediate line widths and spacing.

Figure 2A:
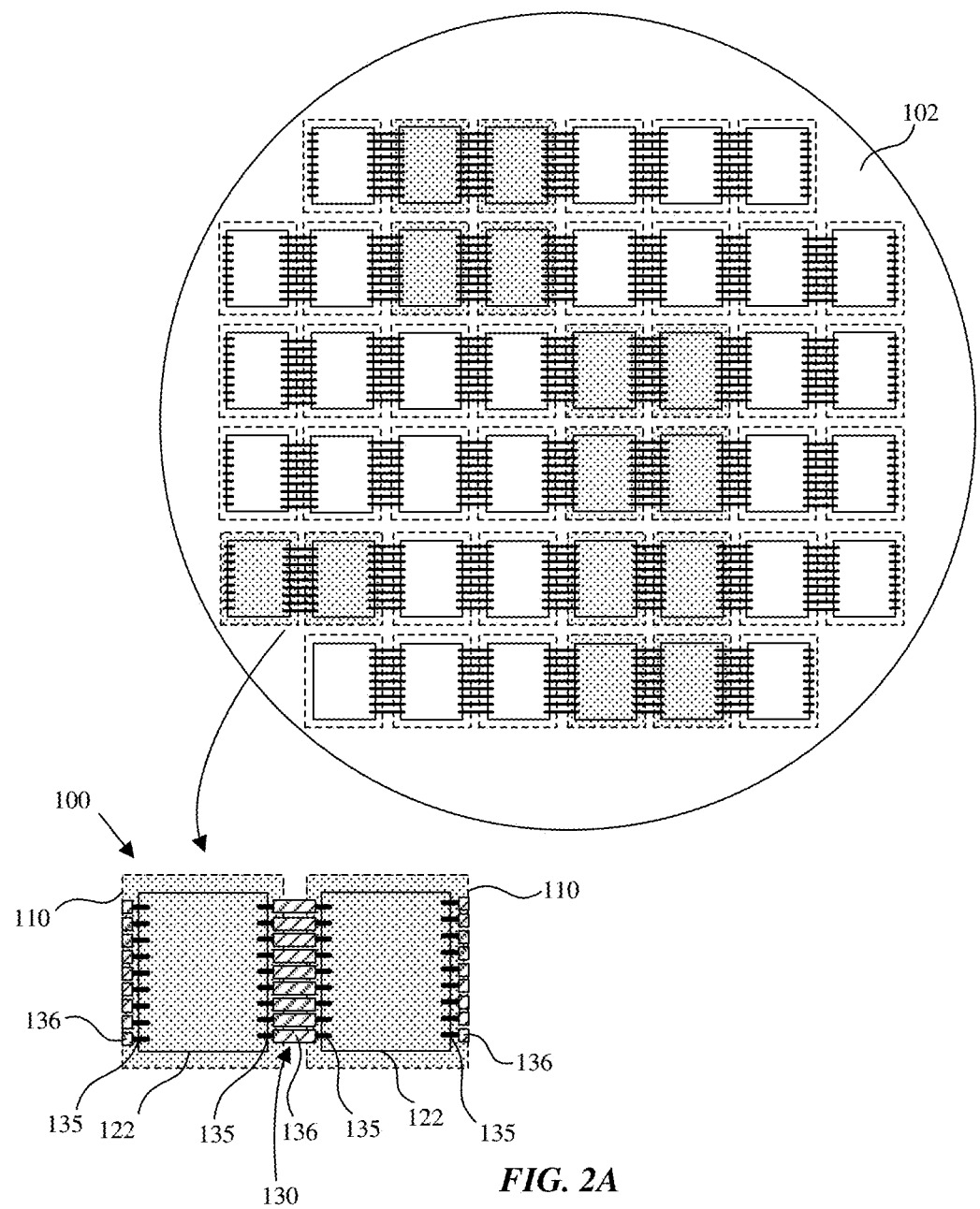
FIG. 2A is a schematic top view illustration of a wafer including an array of die areas in accordance with an embodiment in which adjacent die are interconnected with die-to-die routing extending through metallic seals.

FIG. 2A is a schematic top view illustration of a wafer 102 including an array of die areas 110 in accordance with an embodiment in which adjacent die are interconnected with die-to-die routing 130 extending through metallic seals 122. As illustrated, the metallic seals 122 may be formed directly over peripheries of the die areas 110. In accordance with embodiments, portions of the die-to-die routing 130 may be pre-formed through the metallic seals 122 in each die area 110. FIG. 2A is an illustration of an embodiment, in which some of the adjacent die illustrated with shading are connected with die-to-die routing. Specifically, the die-to-die routing 130 may include a first die routing 135 formed through a first metallic seal 122, and a second die routing 135 formed through a second metallic seal 122. The first and second die routings 135 may be pre-formed in each die area 110. Die routings 135 may be formed of the metal layers 134 and optionally vias 132 within the BEOL build-up structure 120. As shown in the close-up illustration, the die-to-die routing 130 additionally includes stitch routing 136 that physically and electrically connects the first and second die routings 135 of adjacent die, and more specifically metal layers 134 of the respective die routings 135.

In an embodiment, the formation of pre-formed die-to-die routing 130 and metallic seals 122 as illustrated in FIG. 2A may facilitate the ability to dynamically scribe out good die sets that have been identified as good die after testing. Thus, scribing can be dynamically adjusted per wafer 102 since passing and failing clusters may change for each wafer. Additionally, the formation of pre-formed metallic seals 122 and die-to-die routings 130 may facilitate the ability to dynamically change the number of die 104 to be included in each stitched die structure 100. While the exemplary stitched die structure 100 illustrated in FIG. 2A includes two die 104 (illustrated by die areas 110), embodiments are not limited and any number of die 104 may be included, such as three, four, etc. and may be stitched together at different sides. For example, die-to-die routing 130 may be pre-formed at any or all sides of the die areas 110 to allow for dynamic grouping of die sets within the stitched die structures 100.

Figure 2B:
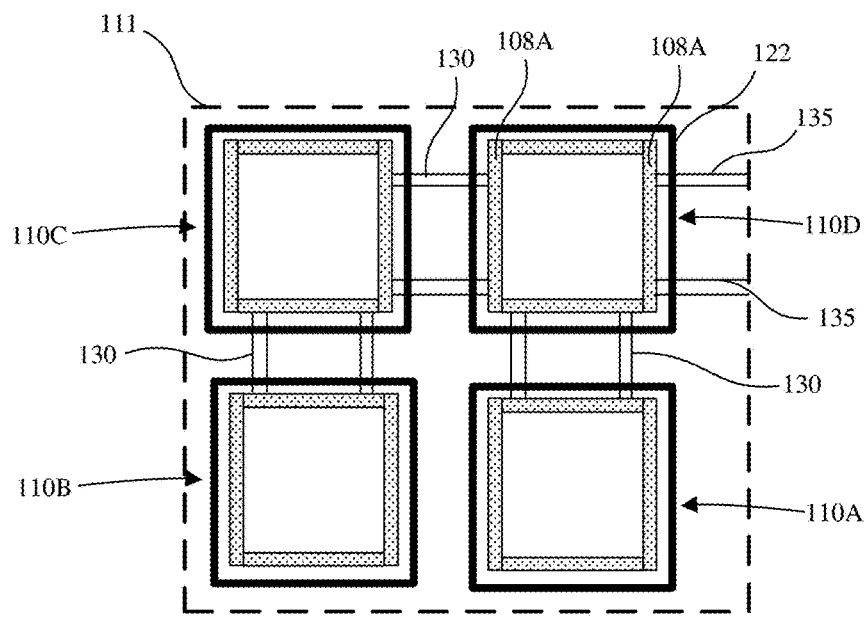
FIGS. 2B-2C are schematic top view illustrations of die areas within reticle patterns in accordance with embodiments.
Figure 2C:
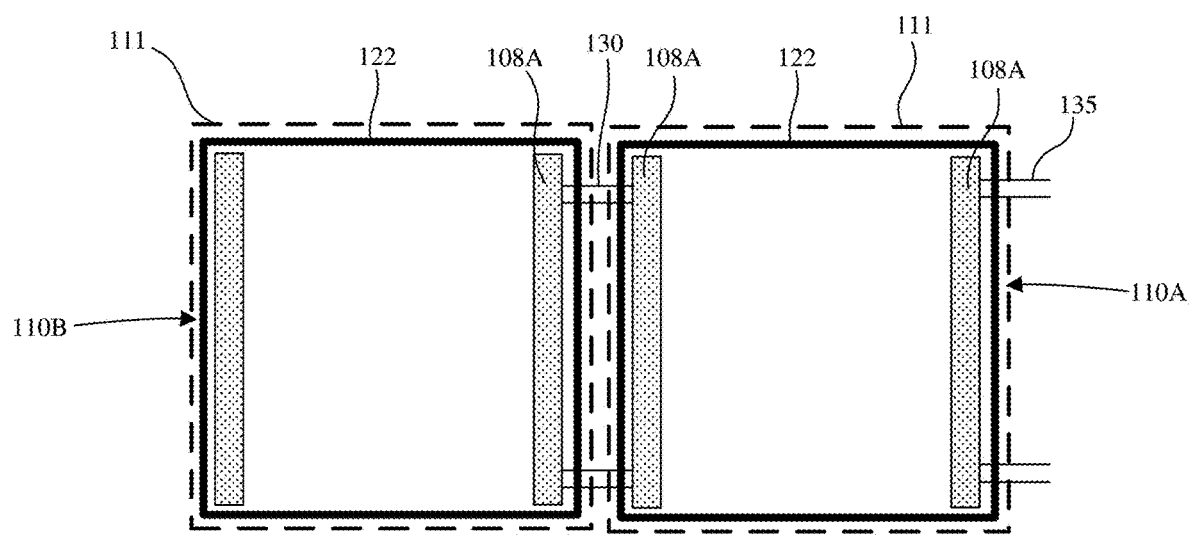

FIGS. 2B-2C are schematic top view illustrations of die areas within reticle patterns in accordance with embodiments. In the exemplary embodiment illustrated in FIG. 2B multiple die areas 110 fit inside a single reticle area 111. For example, each die area 110A-110D may be a same die 104 (e.g. GPU, CPA) or the multiple die areas 110A-11D may include multiple different dies 104. In the embodiment illustrated in FIG. 2B a single reticle pattern includes multiple die areas 110. As described in further detail below, any or all of the die areas 110 may include die-to-die input/output circuits 108A interconnected with die-to-die routing 130. Die routings 135 may additionally extend from one or more die areas 110A-D for potential connection with an adjacent die of an adjacent reticle area 111. In an embodiment, adjacent die 110 with a single reticle pattern 111 can be connected with die-to-die routing 130 which may include only die routings 135, or alternatively a combination of die routings 135 and stitch routing 136, or both. For example, some die areas 110 may be connected with die routings 135 only, while others are connected with a combination of die routings 135 and stitch routing 136. In the embodiment illustrated in FIG. 2C, a single reticle pattern includes a single die area 110. Adjacent die areas 110 of adjacent reticle areas 111 may be the same or different types of dies. In an embodiment, die-to-die routing 130 between adjacent die areas 110 of adjacent reticle areas 111 is connected with a combination of die routings 135 and stitch routing 136.

Figure 2D:
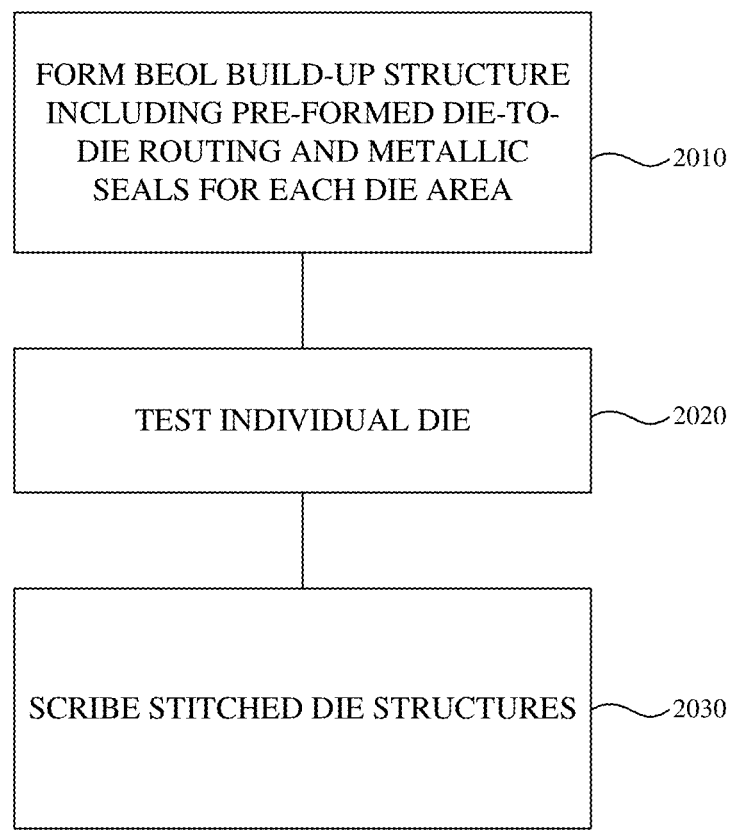
FIG. 2D is a flow chart of a method of forming a stitched die structure with pre-formed metallic seal in accordance with embodiments.

Referring now to FIG. 2D, a flow chart is provided of a method of forming a stitched die structure 100 with pre-formed metallic seal in accordance with embodiments. At operation 2010 a BEOL build-up structure 120 is formed over the wafer 102 including pre-formed die-to-die routing 130 and metallic seals 122 for each die area 110. The individual die 104 are then tested at operation 2020. Testing may be performed at wafer level and may be performed using non-contact circuit probes (e.g. radio frequency) or contacting circuit probes with contact pads. In accordance with embodiments, testing may be used to bin the die into groups, for example, to identify good and bad die clusters. Die sets within good clusters may then be dynamically scribed out into specified stitched die structures 100 at operation 2030. As shown in FIG. 2A scribing may be accompanied by cutting through stitch routing 136, or optionally die routing 135, or both. However, since this cut portion of the die-to-die routing 130 will not be used, this may not affect performance of the stitched die structure 100. Following dicing the die sets may be packaged, followed by a final package level test of the die sets.

Figure 3:
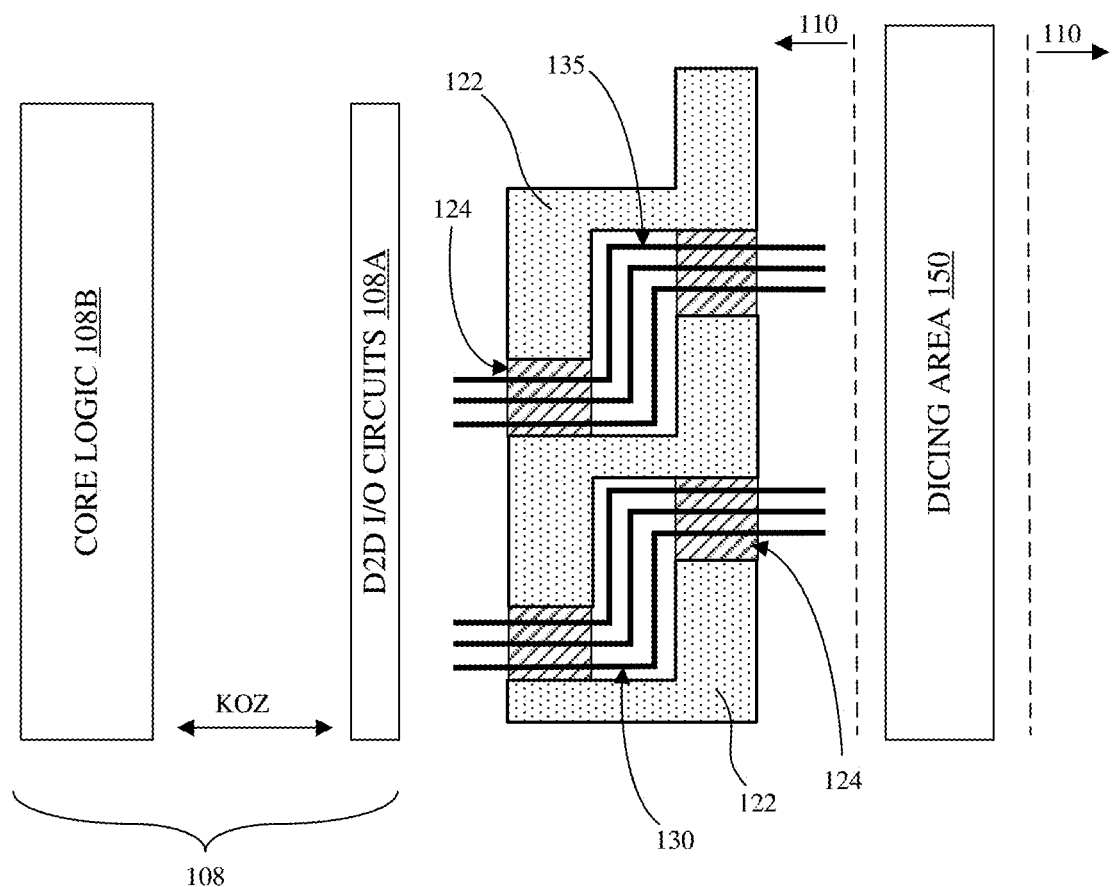
FIG. 3 is a schematic illustration of a pre-formed routing extending through a metallic seal in accordance with an embodiment.

FIG. 3 is a schematic illustration of a pre-formed die routing 135 extending through a metallic seal 122 in accordance with an embodiment. The schematic illustration in FIG. 3 illustrates a dicing area 150 between two adjacent die areas 110 on a wafer 102. As shown by the arrows, in a direction starting from a diced die 104 edge illustrated by the dotted line, each die 104 includes a metallic seal 122 which may surround an active area 108 including die-to-die input/output circuits 108A and core logic circuits 108B located more centrally inside the die area 110. For example, sensitive circuits such as SRAM may be located centrally within the die area 110, and separated from the die-to-die input/output circuits 108A by a keep out zone (KOZ).

In accordance with embodiments, the pre-formed die routing 135 that extends through the metallic seal 122 may terminate prior to, or extend past, the pre-determined edge of the die area 110 that results from dicing. Thus, when adjacent die 104 are diced, the terminal ends of the pre-formed die routing 135 or stitch routing is not connected to an adjacent die.

Die routing 135 may be formed through the metallic seals 122 in a variety of configurations. In many embodiments, the die routing 135 is formed through the metallic seals 122 (e.g. seal rings) to prevent a clear line of sight. This may be accomplished using single level die routing 135 (e.g. within a single metal layer in the BEOL build-up structure), multiple level die routing 135 (e.g. within multiple metal layers in the BEOL build-up structure), and through formation the die routing 135 through multiple metallic seals 122. In the embodiment illustrated in FIG. 3, the pre-formed die routing 135 extends through an opening 124 in the metallic seal 122. Like the die routing 135, the opening 124 may be a single level or multiple level opening. In an embodiment, the die routing 135 illustrated in FIG. 3 may be considered a single level routing formed through a single level opening 124. Still referring to FIG. 3, as illustrated, multiple die routings 135 may be formed through a single opening 124 in the metallic seal 122. Additionally, multiple openings 124 and die routings 135 may be formed within a single level of the BEOL build-up structure. Referring back to FIG. 1, in accordance with embodiments, multiple die routings 135 may be formed through multiple openings 124 in multiple levels of the BEOL build-up structure. Furthermore, the die routings 135 within different levels may be formed with different, or the same, rules for line widths and spacing.

Figure 4A:
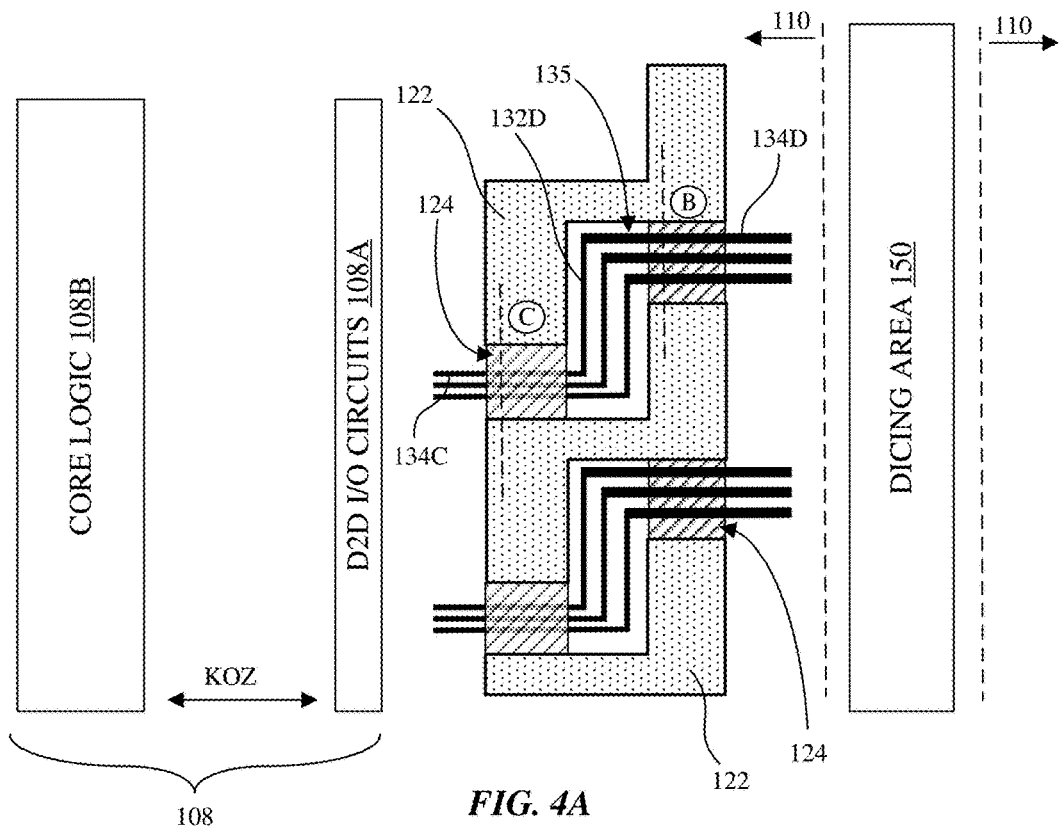
FIG. 4A is a schematic illustration of a multiple level pre-formed routing extending through a metallic seal in accordance with an embodiment.
Figure 4B:
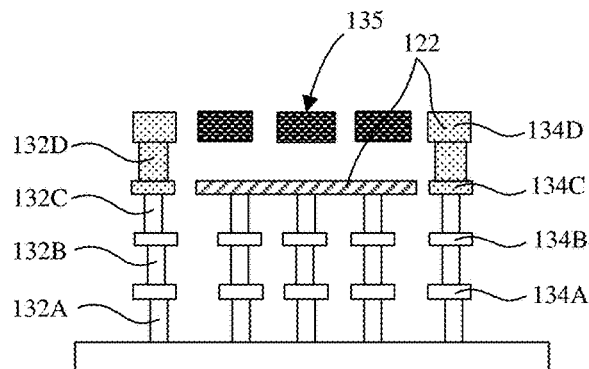
FIG. 4B is a schematic side view illustration taken along upper level section B of FIG. 4A in accordance with an embodiment.
Figure 4C:
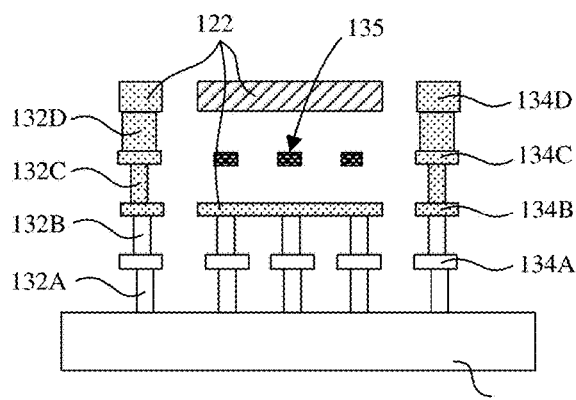
FIG. 4C is a schematic side view illustration taken along lower level section C of FIG. 4A in accordance with an embodiment.

Referring now to FIG. 4A, a schematic illustration is provided of a portion of multiple level pre-formed die routing 135 extending through a metallic seal 122 in accordance with an embodiment. FIG. 4A is substantially similar to FIG. 3, with one difference being the multiple level die routing 135 is formed from multiple levels and metal layers of the BEOL build-up structure. Such a multiple level structure is additionally illustrated in the schematic side view illustrations of FIGS. 4B-4C taken along sections B and C of FIG. 4A, respectively. By way of example, FIGS. 4B-4C illustrate a BEOL build-up structure including four metal layers 132A-132D connected by four vertical interconnect (e.g. via) layers 132A-132D. The metallic seal 122 is illustrated by light shading, while the die routing 135 is illustrated by darker shading. In an embodiment, the die routing 135 enters the metallic seal 122 in a lower metal level (e.g. 134C) and exits the metallic seal 122 (toward the die edge) in an upper metal level (e.g. 134D) that is above the lower metal level. Also shown in FIGS. 4A-4C, in an embodiment, the metal layer in the lower metal level may have a finer line width, thickness, spacing, pitch, etc. compared to the metal layer in the upper metal level. Alternatively, the die routing may enter the metallic seal 122 in the upper metal level that is above the lower metal level, and exit the metallic seal 122 in the lower metal level.

Figure 4D:
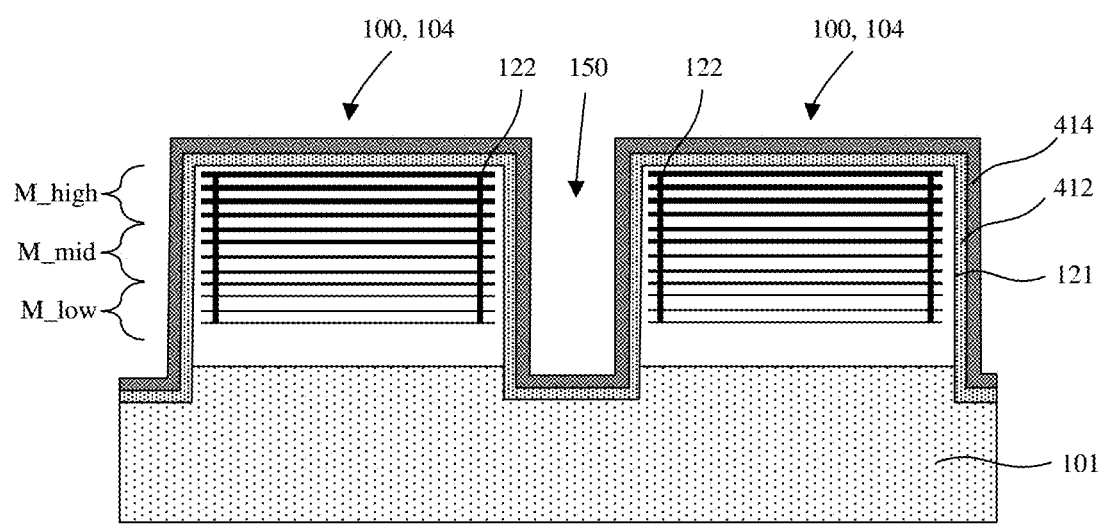
FIG. 4D is a schematic cross-sectional side view illustration of partially diced dies with additional passivation in accordance with an embodiment.

Referring now to FIG. 4D, additional barriers may be included to provide additional protection, for example to moisture diffusion. In some applications it may be worthwhile to provide additional passivation to ensure process design compliance standards are met. This can be particularly pertinent to low dielectric constant (low-k) materials used with the finer and lower metal layers. For example, this may be due to the ability to moisture to diffuse through materials in the build-up structure, and low-k materials in particular. In the embodiment illustrated in FIG. 4D, the adjacent die 104 or stitched die structures 100 are partially scribed, followed by a conformal deposition of one or more barrier layers 412, 414. Exemplary barrier layers include, but are not limited to, inorganic materials such as oxides (e.g. $SiO_2$, $Al_2O_3$, etc.) and nitrides (e.g. silicon nitride, etc.). In an embodiment, the one or more barrier layers 412, 414 are deposited using a conformal deposition technique such as, chemical vapor deposition, physical vapor deposition (with incremental step coverage such as with ion/plasma energy assist, and source to trench angle management) etc. The one or more barrier layers may have a substantially uniform thickness spanning along build-up structure diced edge 121 (e.g. sidewalls) that is substantially orthogonal to the metal layers (e.g. M_high, M_mid, M_low, etc.). Following deposition of the one or more barrier layers 412, 412, the one or more barrier layers may be patterned to expose chip contact pads at the upper metallization layers, followed by dicing through semiconductor substrate 101 to form discrete die 104 or stitched die structures 100.

Figure 5:
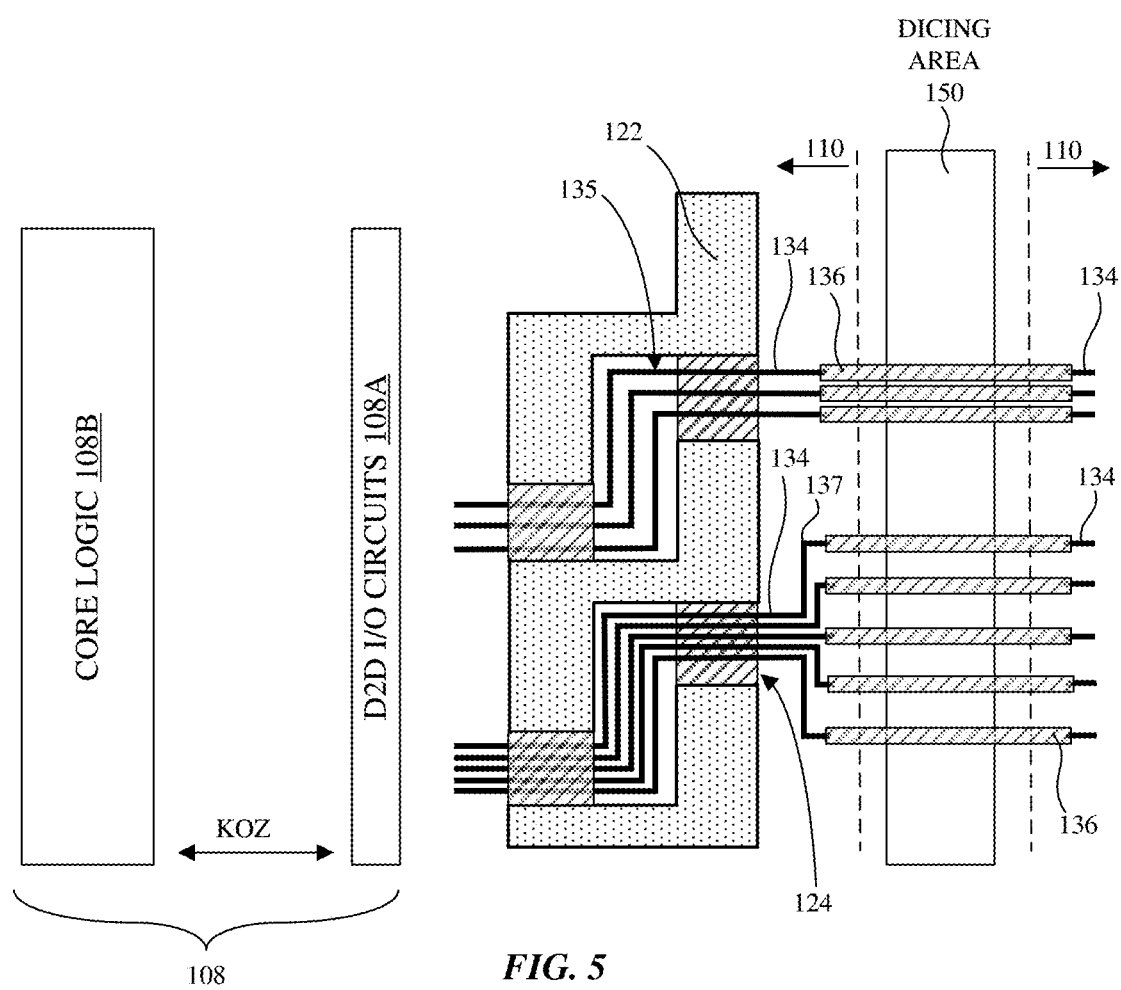
FIG. 5 is a schematic illustration of a portion of die-to-die routing including stitch routing connected to routing that extends through a metallic seal accordance with an embodiment.

FIG. 5 is a schematic illustration of a portion of die-to-die routing 130 including stitch routing 136 connected to die routing 135 that extends through a metallic seal 122 accordance with an embodiment. FIG. 5 differs from FIGS. 3 and 4A, with the addition of stitch routing 136 and fan out region 137. In one embodiment, the die routing 135 exiting the metallic seal 122 may include a fan out region 137 where the routing line pitch or spacing is increased. This may facilitate the alignment of stitch routing 136 with a coarser line width, spacing, or pitch compared to the metal layer 134 used to form die routing 135. Fan out routing 137 may additionally facilitate routing through the metallic seal 122 at a finer pitch (chip like pitch) compared to the stitch routing 136. This may reduce the gap, or opening 124, in the metallic seal 122 and reduce exposure. Thus, the die routing 135 may navigate through the metallic seal 122 using chip-like design rules to minimize the gap, or opening 124, in the metallic seal 122, and then widen to manufacturing requirements for stitching. In an embodiment, where fan out region 137 is not present, stitch routing 136 may still include coarser line width, with reduced spacing, where line pitch remains the same. Stitch routing 136 may have the same thickness as the metal layer 134, for example to use the standard dielectric layer for the particular level within the BEOL build-up structure.

By way of example, in an embodiment stitch routing 136 may have a pitch of 1 μm (0.5 μm line width, μm line spacing). This may correspond to a wiring density of 1,000 wires/mm/layer. In such an example, the on-chip design rule for that BEOL layer may be 0.2 μm pitch (0.1 μm line width), which may correspond to a wiring density of 5,000 wire/mm/layer. Thus, 1 mm of beachfront in the stitching area may accommodate 1,000 wires, while the metallic seal 122 opening 124 may have a reduced size such as 0.2 mm. The remaining 0.8 mm can be full seal area, allowing for greater seal coverage.

Figure 6A:
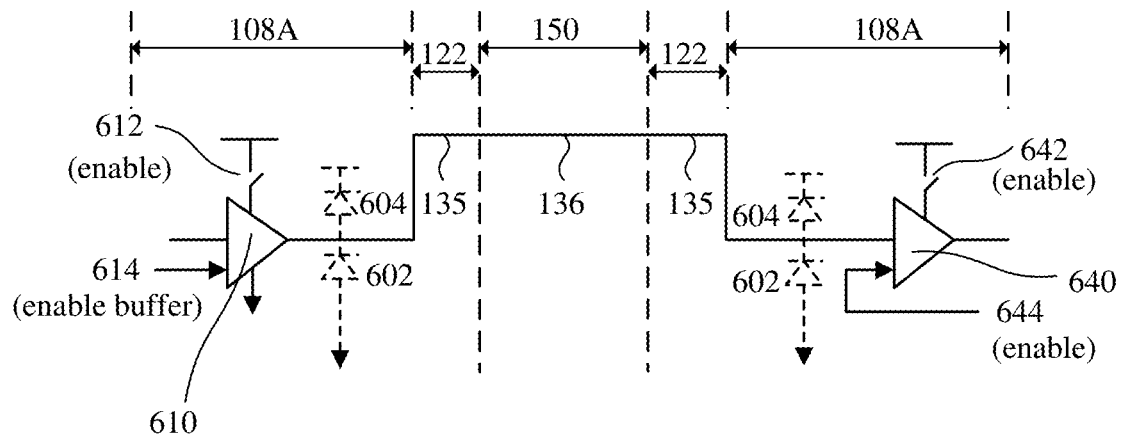
FIG. 6A is a circuit diagram for two connected dies in accordance with an embodiment.
Figure 6B:
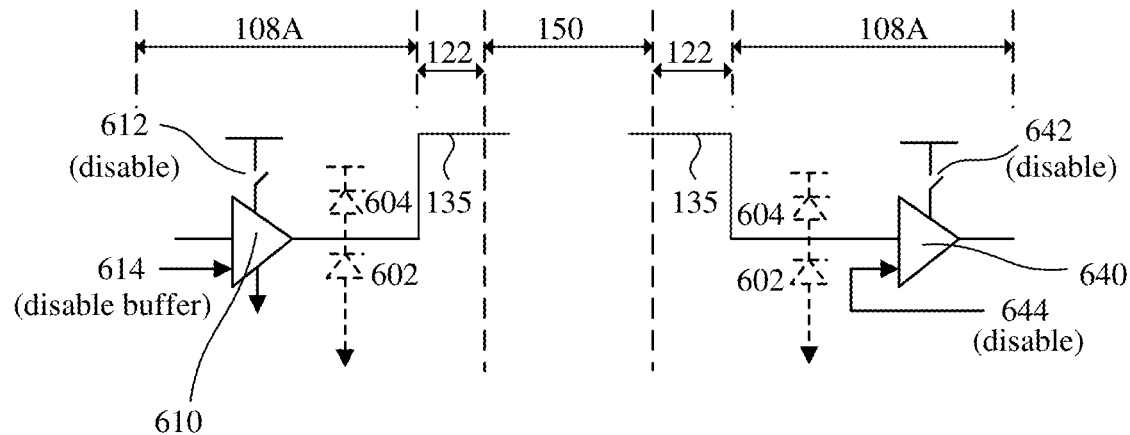
FIG. 6B is a circuit diagram for two diced dies in accordance with an embodiment.

Referring now to FIGS. 6A-6B the die-to-die input/output circuits 108A may optionally include protection circuits 600 in accordance with embodiments. The protection circuits 600 may mitigate leakage or charging along die routings 135. For example, the protection circuits 600 may mitigate charging along the die routings 135 due to dicing (e.g. saw, laser, plasma), debonding, etc. The protection circuits 600 may also disable unconnected/diced dies 104 and mitigate leakage of unconnected die routings 135. FIG. 6A is a circuit diagram for two connected dies in accordance with an embodiment. FIG. 6B is a circuit diagram for two diced dies in accordance with an embodiment.

In accordance with embodiments, a stitched die structure 100 may include a semiconductor substrate 101 including a first die area 110A of a first die 104A and a second die area 110B of a second die 104B separate from the first die area 110A, as illustrated in FIG. 1. As shown in FIGS. 3-5, the first die area 110A includes a first core logic circuit region 108B and a first die-to-die input/output circuit region 108A, and the second die area 110B includes a second core logic circuit region 108B and a second die-to-die input/output circuit region 108A. The BEOL build-up structure 120 spans over the first die area 110A and the second die area 110B, the BEOL build-up structure 120 includes a die-to-die routing 130 to electrically connect the first die-to die input/output circuit region 108A to the second die-to-die input/output circuit region 108A. The die-to-die routing 130 may include a first die routing 135, a second die routing 135, and a stitch routing 136 physically connecting the first die routing 135 to the second die routing 135. The stitch routing 136 may have a wider line width than the first and second die routings 135. The stitch routing 136 may additionally have a coarser line pitch than the first and second die routings 135. Further, the stitching may include the higher, middle and/or lower metal layers based on requirements (e.g. wiring, shoreline available), and cost tradeoffs (e.g. extra lithography costs, extra passivation if M_mid or M_low are used).

Referring now specifically to FIGS. 6A-6B, the first die-to-die input/output circuit region 108A in includes a driver 610, and the second die-to-die input/output circuit region 108A includes a receiver 640. The die routings 135 of the first die area 110 are connected to a driver 610 output on one side of the dicing area 150, and die routings 135 of the second die area 110 are connected to a receiver 640 input on an opposite side of the dicing area 150 in a driver-receiver configuration. When the adjacent die areas 110 are connected (e.g. with stitch routing 136), the power switch 612 and high impedance buffer 614 inputs to the driver 610 are enabled, so the buffer is capable of driving signals. Likewise, the power switch input 642 and enable/disable input 644 to the receiver 640 are enabled. When the adjacent die are disconnected (e.g. scribed), the power switch input 612 and high impedance buffer enable/disable input 614 to the driver 610 are disabled. Likewise, the power switch input 642 and enable/disable input 644 to the receiver 640 are disabled (driver tristated). In alternative embodiments, thick oxide devices, or a cascading device can be implemented to add robustness to the interface. The figure shows a unidirectional link for simplicity, but a bi-directional link is also feasible.

The protection circuits 600 illustrated in FIGS. 6A-6B are optional, and embodiments are not limited to those particular configurations illustrated. As shown, the protection circuits 600 may include one or more antenna diodes 602, 604 or other suitable structure, such as a grounded gate device (core or thick oxide), etc. Antenna diodes as described herein are small diodes, for handling process level charging, and very small electrostatic discharge (ESD) events. These may be much smaller than (formal or regular IO) ESD protection circuits. In accordance with some embodiments, the driver 610 and receiver 640 may be formed with thick oxide devices, and protection circuits 600 are not included. In accordance with embodiments, one or more protection circuits 600 may be included to protect the dies when they are diced apart. In a first configuration, only a single antenna diode 602 is present adjacent the receiver 640 side (with no protection circuit on the driver 610 side). In an embodiment, antenna diode 602 is coupled to ground or low voltage source (e.g. Vss). In a second configuration, a plurality of antenna diodes 602, 604 are present adjacent the receiver 640 side (with no protection circuit on the driver 610 side). In an embodiment, antenna diode 604 is coupled to a high voltage or power source (e.g. Vdd). In a third configuration one or more antenna diodes 602, 604 are coupled to the receiver 640 side and an antenna diode 602 is coupled to the driver 610 side. In a fourth configuration, one or more antenna diodes 602, 604 are coupled to the receiver 640 side and a plurality of antenna diodes 602, 604 are coupled to the driver 610 side.

In a specific embodiment, the second die-to-die input/output circuit region 108A (right) includes an antenna diode 602 coupled to the second die-to-die routing 135 between the receiver 640 and the stitch routing 136. In an embodiment, the first die-to-die input/output circuit region 180A (left) comprises a second antenna diode 602 coupled to the first die-to-die routing 135 between the driver 610 and the stitch routing 136. In an embodiment, the first die area 110 (left) includes a third die-to-die input/output circuit region 108A including a second receiver 640 opposite the first core logic circuit region from the first die-to-die input/output circuit region 110, and the receiver 640 is coupled with a third die routing 135 that terminates near a diced edge 121 of the stitched die structure 100. For example, one or more antenna diodes 602, 604 may be coupled to the third die routing 135 between the receiver 640 and the terminal end of the third die routing 135 near the diced edge 121 of the stitched die structure 100. Such a structure is at least partially illustrated in FIG. 6B (right) as combined with FIG. 6A (left).

Figure 7A:
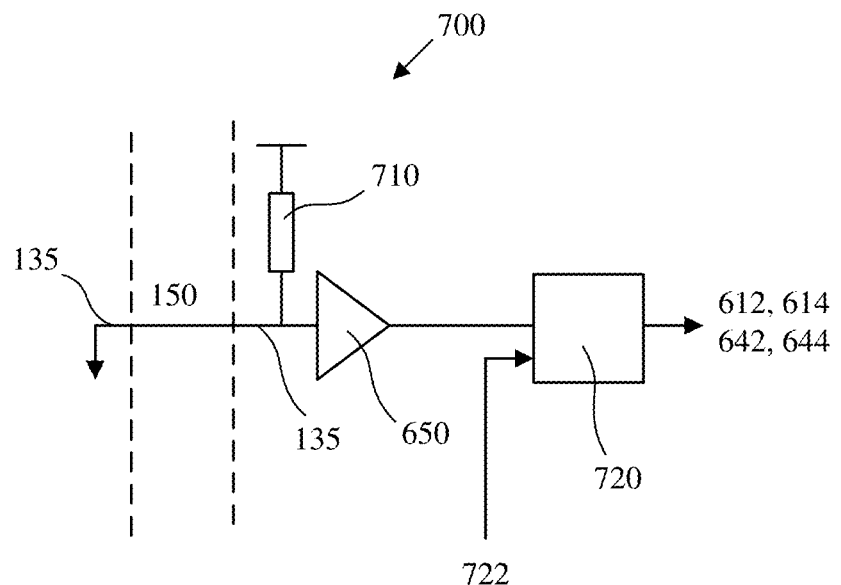
FIG. 7A is a detection circuit diagram for a connected die routings accordance with an embodiment.
Figure 7B:
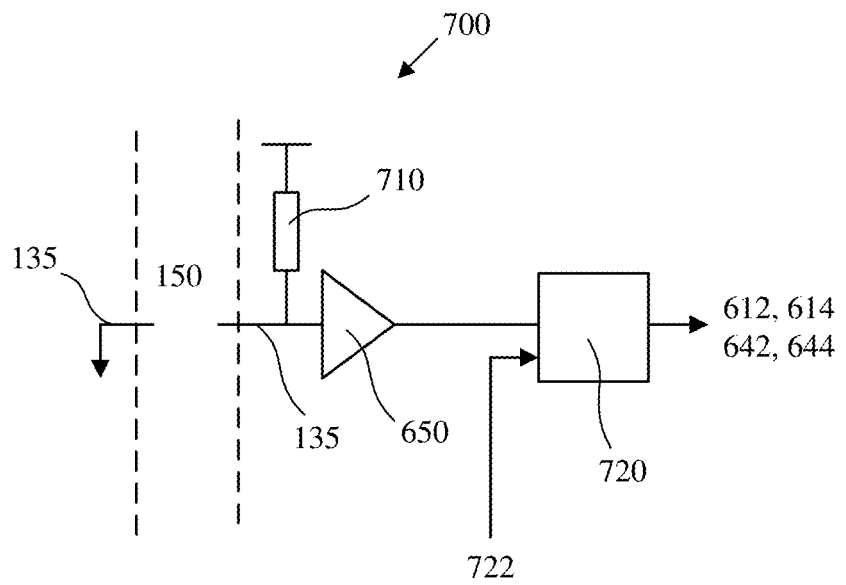
FIG. 7B is a detection circuit diagram for unconnected die routings in accordance with an embodiment.

In accordance with embodiments, the die-to-die input/output circuits 108A may optionally include a hardware based detection circuit in accordance with embodiments. For example, a detection circuit may be coupled to the receiver 640 and another die routing to detect presence (or absence) of the first die, or alternatively coupled to the driver 610 and a another die routing to detect presence (or absence) of the second die. FIG. 7A is a detection circuit diagram for a connected die routings accordance with an embodiment. FIG. 7B is a detection circuit diagram for unconnected die routings in accordance with an embodiment. As shown, the detection circuit 700 may include a pullup 710 connected to a die routing 135 between the die area 110 edge and a receiver 650. The receiver 650 output is then provided to a logic 720, which is then directed to the enable inputs 612, 614, 642, or 644, each with appropriate timing and polarity. Additionally, software controls 722 (such as power states, repair, etc.) are input to the logic 720. A detect signal from the detection circuit 700 may be utilized to set other configuration properties such as the power switch and input enable/disable to the driver 610 or receiver 640. For example, in application if the receiver 650 senses a low detect signal, then the adjacent die is present. If the receiver senses a high detect signal, then an adjacent die is absent, not connected. The particular embodiment illustrated in FIG. 7A is one implementation for how connected dies can be detected in hardware on a system on chip. In operation, a signal could be sent from a die on one side, and checked in a die on the other side to establish presence etc. Other alternatives are envisioned in accordance with embodiments, such as a fused bit, or board or package strapping.

Figure 8A:
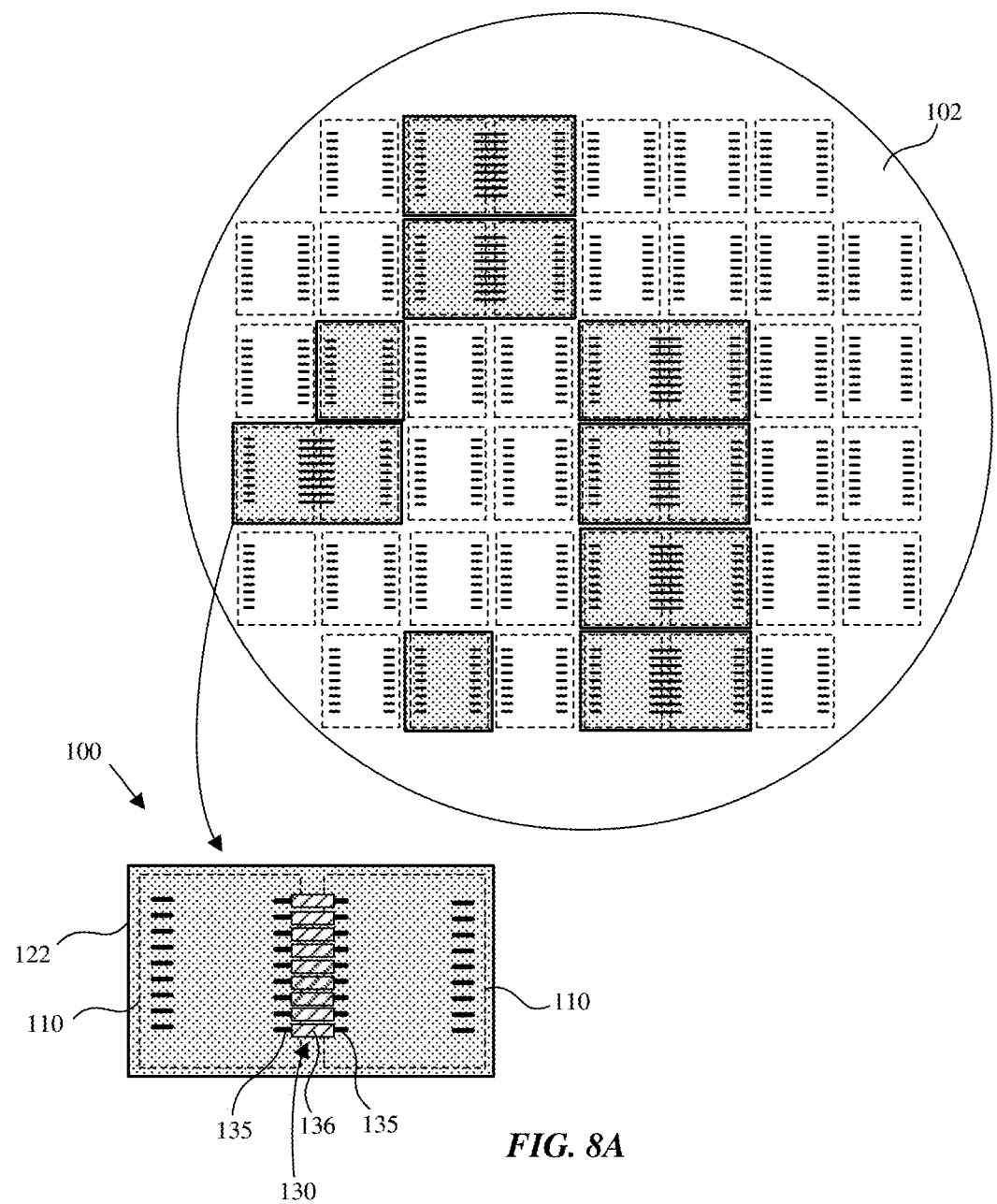
FIG. 8A is a schematic top view illustration of a wafer including an array of die areas in accordance with an embodiment in which a metallic seal is formed around adjacent die that are interconnected with die-to-die routing.

Referring now to FIG. 8A a schematic top view illustration is provided of a wafer 102 including an array of die areas 110 in accordance with an embodiment in which a metallic seal 122 is formed around adjacent die 104 and die areas 110 that are interconnected with die-to-die routing 130. Similar to the discussion with regard to FIG. 2A, as shown in the close-up illustration in FIG. 8A, the die-to-die routing 130 additionally includes stitch routing 136 that physically and electrically connects the first and second die routings 135 of adjacent die. The die routing 135 and stitch routing 136 with regard to FIG. 8A may be formed similarly as those described above with regard to FIGS. 1-5, with omission of extending through a metallic seal 122. One difference compared to FIG. 2A, is that metallic seals 122 are selectively formed outside of the peripheries of the die areas 110. Thus, the metallic seals 122 in the embodiment illustrated in FIG. 8A are not pre-formed with the reticles used to form die areas 110. Instead, the metallic seals 122 may be formed after formation of the BEOL build-up structure 120, after dicing, or using the stitching tool used to form stitch routing 136 concurrent with formation of the BEOL build-up structure 120. In accordance with the embodiment illustrated in FIG. 8A, die routing 135 may be still be pre-formed with the reticles used to form die areas 110. Likewise, active areas 108 including die-to-die input/output circuits 108A and core logic circuits 108B may be similarly formed.

In an embodiment, the formation die-to-die routing 130 and selection of scribe/dicing areas is customized around each die 104. While the exemplary stitched die structure 100 illustrated in FIG. 8A includes two die 104 (illustrated by die areas 110) examples, embodiments are not limited and any number of die 104 may be included, such as three, four, etc. and may be stitched together at different sides. For example, die routing 135 may be pre-formed and stitch routing 136 may be selectively formed at any or all sides of the die areas 110 to allow for the formation of die-to-die routing 130 between any adjacent die 104. In an embodiment, die routing may also be selectively formed.

Figure 8B:
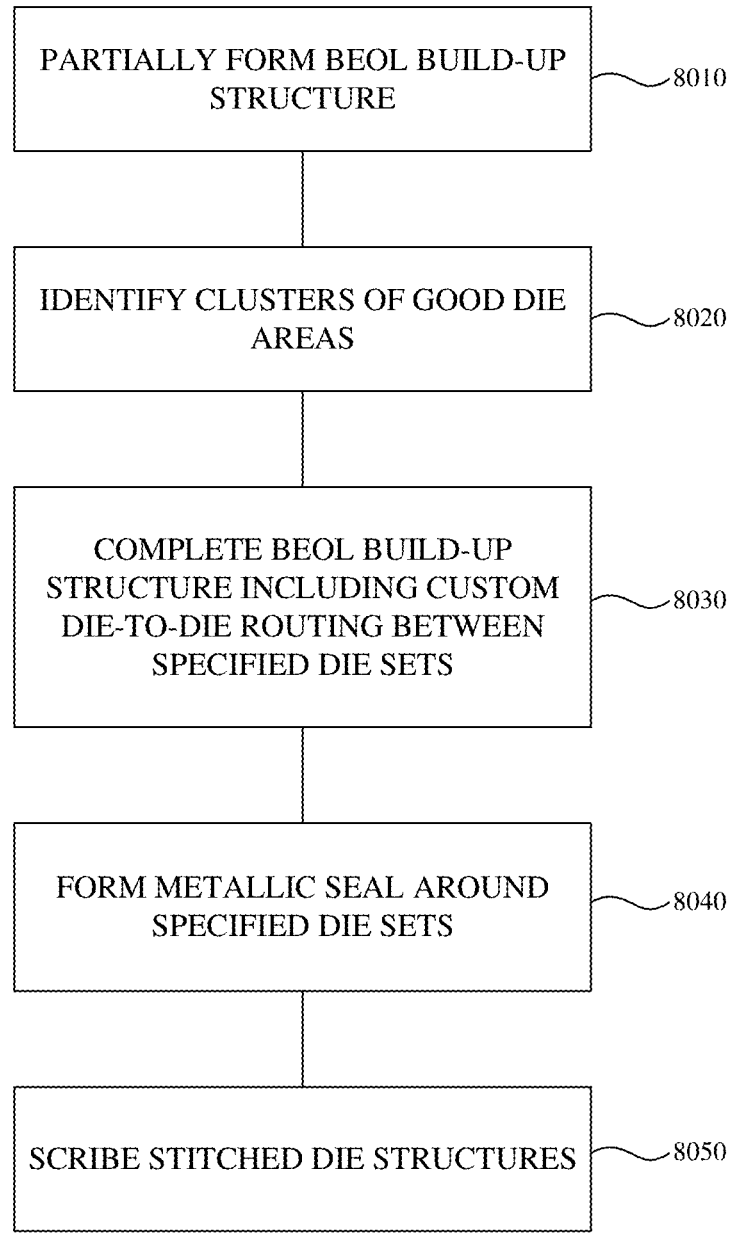
FIG. 8B is a flow chart of a method of forming a stitched die structure with a custom metallic seal in accordance with embodiments.

Referring now to FIG. 8B, a flow chart is provided of a method of forming a stitched die structure 100 with a custom metallic seal in accordance with embodiments. At operation 8010 the BEOL build-up structure 120 is partially formed. That is, a significant portion of the metal routing is formed, yet processing has not continued to the point of fabricating the bond pads. At this stage processing of the metal routing has not yet reached the point for conventional wafer testing methods. At operation 9020 die clusters are binned (e.g. identified as good or bad) based on process data. For example, the process data may be based on early electrical test data from front-end-of-the-line (FEOL) and/or early BEOL fabrication stages, optical test data, and yield trends for wafer die location. Data may include electrical test or optical inspection data. For example electrical test data may include probed (touch) tests to determine electrical quality of transistors or interconnects, simple circuits (e.g. ring oscillator or the like). Probed touchdown testing may be accompanied by a subsequent clean/repair operations. An exemplary configuration is illustrated and described in more detail with regard to FIG. 9. No-touch testing may also be utilized to bin the dies. Exemplary no-touch testing methods include optical inspection, and systematic (e.g. wafer maps) and historical trends, and project yield to identify the die sets. No-touch testing may include radio frequency, or optical probes, or probing on a remote area with test signals propagated to DUT (as in FIG. 9). Based on this information, the formation of the BEOL build-up structure 120 is completed at operation 8030 to include die-to-die routing 130 between specified die sets. Dies 104 within bad clusters may not be interconnected. In some embodiments, metallic seals 122 are only formed around the specified die sets that will become the stitched die structures 100 at operation 8040. In this manner, the uncommitted layers of the BEOL structure can then be used to form the custom seal rings, routings, and die sets. Additionally, custom routing 1125 patterns to input/output circuits 1010 can be fabricated, as discussed in more detail with regard to FIGS. 10-11B. In an embodiment, metallic seals 122 are formed after formation of the BEOL build-up structure 120. This may include a pre-dicing operation to expose diced edges 121 of the BEOL build-up structure 120 of the stitched die structures 100. The stitched die structures 100 are then scribed at operation 8050.

While the embodiments illustrated and described with regard to FIGS. 2A-2D and 8A-8B are described and illustrated separately, some aspect of these description may be combined. For example, the process data relied upon in the discussion of FIGS. 8A-8B to bin the dies 104 into different clusters can also be utilized in the process sequence described with regard to FIGS. 2A-2D. In this manner, stitch routing 136 may be more selectively formed. In such a circumstance, dicing associated with FIGS. 2A-2D may not be accompanied by cutting through a die-to-die routing 130.

Figure 9:
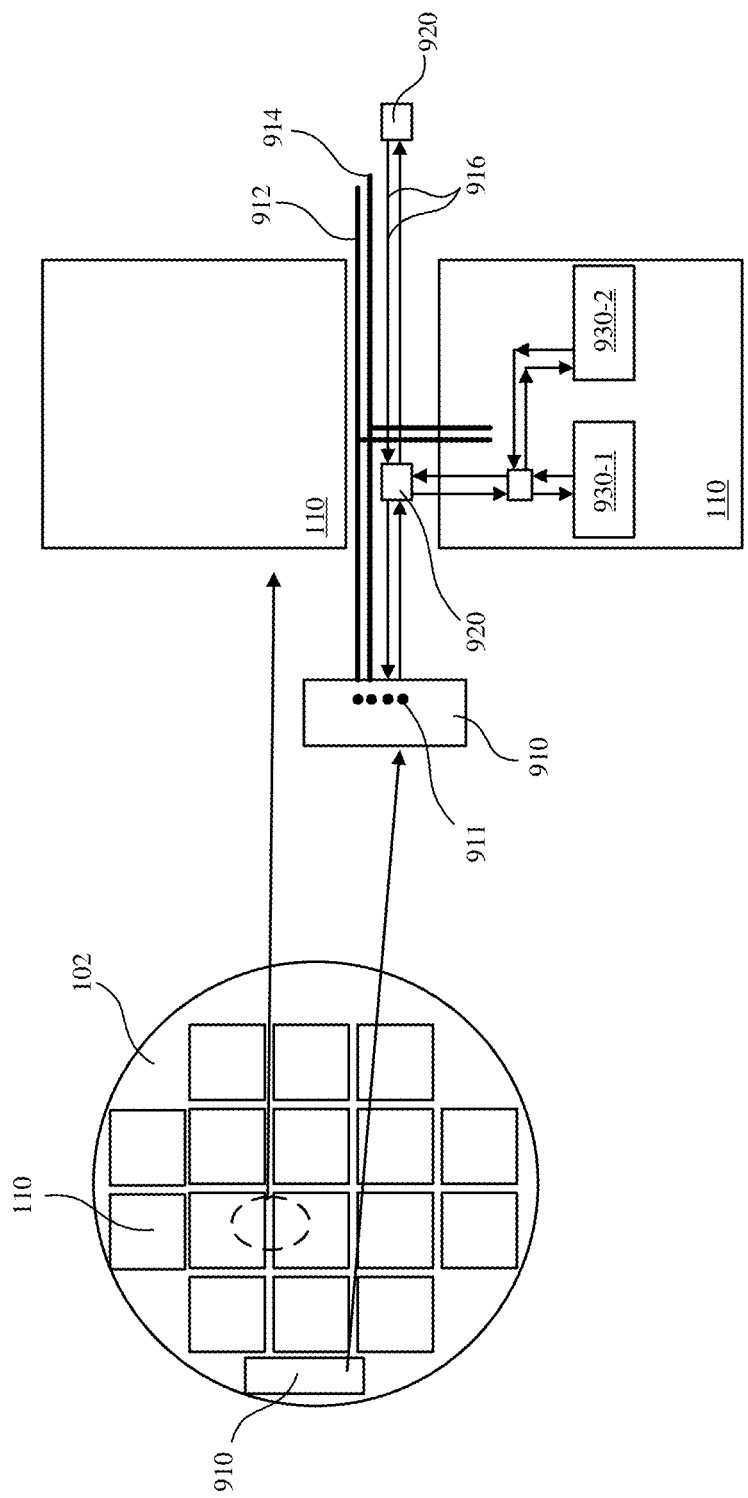
FIG. 9 is a schematic top view illustration of a probing arrangement on a wafer supporting an array of dies in accordance with an embodiment.

In accordance with some embodiments, and particularly those including custom die-to-die routing, seal rings, and scribes, determining the die quality may be best guessed, with a hard test not being performed prior to committing to die sets. In some embodiments, the die areas 110 may be tested prior to forming the BEOL build-up structure 120 and/or early BEOL build-up structure 120 stages, followed by a determination of die 104 sets. FIG. 9 is a schematic top view illustration of a probing arrangement on a wafer 102 supporting an array of dies in accordance with an embodiment. In such a configuration probing may require a touch in a probe area 910, followed by a low-cost clean. The probe area 910 may include a plurality of pins (or pads) 911 connected to various lines such as power or ground lines 912, clock lines 914, and test lines 916. Test lines 916 may optionally be connected to a series of aggregators, repeaters, multiplexers 920 to allow a plurality of die areas 110 to be tested in parallel. As shown, each die area 110 may additionally include a plurality of logic blocks 930-1, 930-2, etc. Such a test structure may be fabricated on a partially formed BEOL build-up structure 120.

Fabrication of a custom seal ring 122, such as with the embodiment described with regard to FIGS. 8A-8B, can additionally facilitate the ability to reconfigure a custom I/O connections for the dies 104 or die sets 100. FIG. 10 is a schematic illustration of a die 104 or die set 100 input/output circuits 1010 including digital components 1012 and analog components 1014 in accordance with an embodiment. As shown the digital I/O components 1012 and analog I/O components 1014 work together to make an I/O circuit 1010. Each die 104 or die set 100 may include a plurality of I/O circuits 1010 (e.g. 1010-1, 1010-2 . . . 1010-n). The digital components 1012 may provide control and status, while the analog components 1014 may provide the actual driver and receive, and signal conditioning. In accordance with embodiments, if a manufacturer is custom designing the seal ring 122 and die-to-die routing 130 then additional re-programming options are available for the I/O connections to the I/O circuits 1010. For example, this may be accomplished with a direct-write (e.g. laser write, e-beam write) to customize wiring, and may be done at the coarsest lithography levels (though not required), just prior to formation of the I/O connections. Ordinarily I/O connection 1120 (e.g. pin, pad) layout is fixed based on chip/package type (e.g. dynamic random-access memory (DRAM), peripheral component interconnect express (PCIE), etc). FIG. 11A is a schematic illustration of a die I/O connection 1120 configuration with an unused spare I/O circuit 1010-S in accordance with an embodiment. FIG. 11B is a schematic illustration of a die I/O connection 1120 configuration with a connected spare I/O circuit 1010-S in accordance with an embodiment. In the embodiment illustrated in FIG. 11A, the I/O routings 1125 and/or I/O connections 1120 are routed to the plurality of I/O circuits 1010 (e.g. 1010-1, 1010-2 . . . 1010-n, and not routed to the spare I/O circuit 1010-S. In the embodiment illustrated in FIG. 11B, the I/O routings 1125 and/or I/O connections 1120 are re-routed to skip a bad I/O circuit 1010-X (or corresponding circuit connected to the bad I/O circuit) and to also connect to the spare I/O circuit 1010-S. In accordance with an embodiment, re-routing can be implemented during the same operation(s) as forming the customized seal ring 122.

In the exemplary embodiments illustrated in FIGS. 11A-11B, a plurality of input/output circuits 1010 and a plurality of die I/O connections 1120 are coupled to the plurality of I/O circuits 1010 with a plurality of routings 1125. Additionally, one or more I/O circuits 1010 (e.g. 1010-S, 1010-X) are not coupled to a die I/O connection 1120. In an embodiment, a spare I/O circuit 101-S or bad I/O circuit 1010-X located at an end of a series of I/O circuits 1010, or within the series is not coupled. Additionally, this may or may not change the routing 1125 patterns. In an embodiment, there is a first group of the plurality of routings with a first characteristic routing pattern (e.g. top routings in FIG. 11B above bad I/O circuit 1010-X), and a second group of the plurality of routings with a second characteristic routing pattern (e.g. bottom routings in FIG. 11B below bad I/O circuit 1010-X). A difference in the first characteristic routing pattern and the second characteristic routing pattern is correlated with the input/output circuit (e.g. 1010-X, or 1010-S) not being coupled to a die input/output connection 1120. For example, the resultant wiring configuration may be adopted as the result of tests or other means for analyzing the underlying I/O circuits 1010 and/or processing as described with regard to a customized approach.

Referring now to FIG. 12A a schematic top view illustration of a module 1200 (e.g. package) including a stitched die structure 100 in accordance with an embodiment. As shown, the module 1200 may include a stitched die structure 100 mounted on a module substrate 1202, optionally with any other chips 1210. The stitched die structure 100 and optional chip 1210 may be encapsulated within a hermetic seal 1204, which may add additional physical and electrical protection. In accordance with embodiments, the metallic seals 122 within the stitched die structure 100 may provide an added layer of protection for high reliability systems, or alternatively, facilitate relaxing some of the on-chip seal and/or keep out zone requirements for cost-sensitive systems or low reliability systems.

FIGS. 12B-12C are schematic top view illustrations stitched die structures 100 for high reliability systems including multiple metallic seals 122 around active areas 108 in accordance with embodiments. As shown multiple seal rings 122 may be provided for additional protection, and larger keep out zone from the active area 108 to the edge of the die area. Specifically, FIG. 12B is an illustration of a stitched die structure 100 including multiple custom metallic seals 122 formed around multiple die in accordance with an embodiment. FIG. 12C is an illustration of a stitched die structure 100 including multiple pre-formed metallic seals 122 around each die in accordance with an embodiment.

FIGS. 12D-12E are schematic top view illustrations stitched die structures 100 for cost-sensitive or low reliability systems in accordance with embodiments. As shown, the number of metallic seals 122 can be reduced, or even eliminated. Additionally, the keep out zone from the active area 108 to edge of the die area can be reduced. Specifically, FIG. 12D is an illustration of a stitched die structure 100 including a custom metallic seal 122 formed around multiple die in accordance with an embodiment. FIG. 12E is an illustration of a stitched die structure 100 including a preformed metallic seal 122 around each die in accordance with an embodiment.

In utilizing the various aspects of the embodiments, it would become apparent to one skilled in the art that combinations or variations of the above embodiments are possible for forming stitched die structures. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A multi-die structure including:
   a first front-end-of-the line (FEOL) die area of a first die patterned into a semiconductor substrate and a second FEOL die area of a second die patterned into the semiconductor substrate, the second FEOL die area separate from the first FEOL die area;
   wherein the first FEOL die area includes a first die-to-die input/output circuit region, and the second FEOL die area includes a second die-to-die input/output circuit region;
   a back-end-of-the-line (BEOL) build-up structure spanning over the first FEOL die area and the second FEOL die area, the BEOL build-up structure comprising a die-to-die routing to electrically connect the first die-to die input/output circuit region to the second die-to-die input/output circuit region.

2. The multi-die structure of claim 1, wherein the first FEOL die area includes a first core logic circuit region, and the second FEOL die area includes a second core logic circuit region.

3. The multi-die structure of claim 1, wherein the die-to-die routing includes a first die routing, a second die routing, and a stitch routing physically connecting the first die routing to the second die routing.

4. The multi-die structure of claim 3, wherein the stitch routing has a wider line width than the first die routing and the second die routing, and the stitch routing has a coarser line pitch than the first die routing and the second die routing.

5. The multi-die structure of claim 1, wherein the BEOL build-up structure further comprises:
   a first metallic seal directly over a first peripheral area of the first FEOL die area;
   a second metallic seal directly over a second peripheral area of the second FEOL die area; and
   the die-to-die routing extends through a first opening in the first metallic seal and a second opening in the second metallic seal to electrically connect the first die to the second die.

6. The multi-die structure of claim 5, wherein the die-to-die routing enters the first metallic seal in a lower metal level in the BEOL build-up structure and exits the first metallic seal in an upper metal level in the BEOL build-up structure above the lower metal level.

7. The multi-die structure of claim 5, wherein the first FEOL die area includes a third die-to-die input/output circuit region including third die routing that terminates near a diced edge of the multi-die structure.

8. The multi-die structure of claim 5, further comprising one or more barrier layers including a substantially uniform thickness spanning along a diced edge of the multi-die structure substantially orthogonal to metal layers of the BEOL build-up structure.

9. The multi-die structure of claim 1, further comprising a metallic seal around the first FEOL die area, the second FEOL die area, and the die-to-die routing.

10. The multi-die structure of claim 1, wherein the first FEOL die area includes a third die-to-die input/output circuit region including third die routing that terminates near a diced edge of the multi-die structure.

11. The multi-die structure of claim 10, further comprising a plurality of input/output connections coupled to the first die-to-die input/output circuit region and the second die-to-die input/output circuit region.

12. The multi-die structure of claim 10, wherein the third die-to-die input/output circuit region is not coupled to a die input/output connection.

13. The multi-die structure of claim 1, wherein the first die-to-die input/output circuit region in includes a driver, and the second die-to-die input/output circuit region includes a receiver.

14. The multi-die structure of claim 13, wherein the die-to-die routing includes a first die routing and a second die routing, and the second die-to-die input/output circuit region comprises an antenna diode coupled to the second die routing between the receiver and the second die routing.

15. The multi-die structure of claim 14, wherein the first die-to-die input/output circuit region comprises a second antenna diode coupled to the first die routing between the driver and the first die routing.

16. The multi-die structure of claim 14, further comprising a detection circuit coupled to the receiver and a second die routing to detect presence of the first die.

17. The multi-die structure of claim 13, further comprising a buffer enable/disable input to the driver, a first power switch input to the driver, an enable/disable input to the receiver, and a second power switch input to the receiver.

18. The multi-die structure of claim 1, wherein the first die and the second die are different die types.

19. The multi-die structure of claim 1, wherein the first die and the second die are a same die type.

20. The multi-die structure of claim 19, wherein the same die type is selected from the group consisting of a graphics processing unit (GPU) and a central processing unit (CPU).

* * * * *